United States Patent
Yin et al.

(10) Patent No.: US 12,273,644 B2
(45) Date of Patent: Apr. 8, 2025

(54) IMAGE SENSOR AND IMAGE SENSING METHOD JUDGING WHETHER A DIGITAL SENSING SIGNAL IS ABNORMAL

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW); Dean Wang, Taichung (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 247 days.

(21) Appl. No.: 18/302,816

(22) Filed: Apr. 19, 2023

(65) Prior Publication Data

US 2023/0370749 A1    Nov. 16, 2023

Related U.S. Application Data

(60) Provisional application No. 63/341,423, filed on May 13, 2022.

(51) Int. Cl.
*H04N 5/335* (2011.01)
*G06F 1/08* (2006.01)
(Continued)

(52) U.S. Cl.
CPC .............. *H04N 25/78* (2023.01); *G06F 1/08* (2013.01); *H01L 25/0753* (2013.01); *H01L 25/18* (2013.01); *H03K 19/018521* (2013.01); *H03L 7/099* (2013.01); *H04N 25/60* (2023.01); *H04N 25/627* (2023.01); *H04N 25/63* (2023.01); *H04N 25/709* (2023.01); *H04N 25/77* (2023.01); *H04N 25/772* (2023.01); *H04N 25/778* (2023.01); *H04N 25/7795* (2023.01); *H10F 39/026* (2025.01); *H10F 39/8037* (2025.01); *H10F 39/811* (2025.01)

(58) Field of Classification Search
None
See application file for complete search history.

(56) References Cited

U.S. PATENT DOCUMENTS

| | | | |
|---|---|---|---|
| 7,239,433 B2 * | 7/2007 | Otake | H04N 1/00933 358/1.9 |
| 10,771,775 B2 * | 9/2020 | Igarashi | H04N 25/76 |

(Continued)

*Primary Examiner* — Gary C Vieaux
(74) *Attorney, Agent, or Firm* — JCIPRNET

(57) ABSTRACT

An image sensor and an image sensing method are provided. A readout circuit outputs a first digital sensing signal according to a floating diffusion node voltage of a first pixel circuit reset after a reset stage and a floating diffusion node voltage of a second pixel circuit reset after the reset stage during a reset signal readout period. The readout circuit outputs a second digital sensing signal according to a sensing result of the first pixel circuit and the floating diffusion node voltage of the second pixel circuit reset after the same reset stage during a sensing signal readout period. The image processing circuit judges whether a digital number of at least one of the first digital sensing signal and the second digital sensing signal is abnormal to decide to keep an original digital number, directly set a pixel value, or reset the second digital sensing signal.

15 Claims, 8 Drawing Sheets

(51) Int. Cl.
  *H01L 25/075* (2006.01)
  *H01L 25/18* (2023.01)
  *H03K 19/0185* (2006.01)
  *H03L 7/099* (2006.01)
  *H04N 25/60* (2023.01)
  *H04N 25/627* (2023.01)
  *H04N 25/63* (2023.01)
  *H04N 25/709* (2023.01)
  *H04N 25/76* (2023.01)
  *H04N 25/77* (2023.01)
  *H04N 25/772* (2023.01)
  *H04N 25/778* (2023.01)
  *H04N 25/78* (2023.01)
  *H10F 39/00* (2025.01)

(56) References Cited

U.S. PATENT DOCUMENTS

| | | | |
|---|---|---|---|
| 2003/0169464 A1* | 9/2003 | Otake | H04N 1/00053 358/474 |
| 2018/0098060 A1* | 4/2018 | Igarashi | H04N 25/76 |
| 2023/0370743 A1* | 11/2023 | Yin | H10F 39/026 |

* cited by examiner

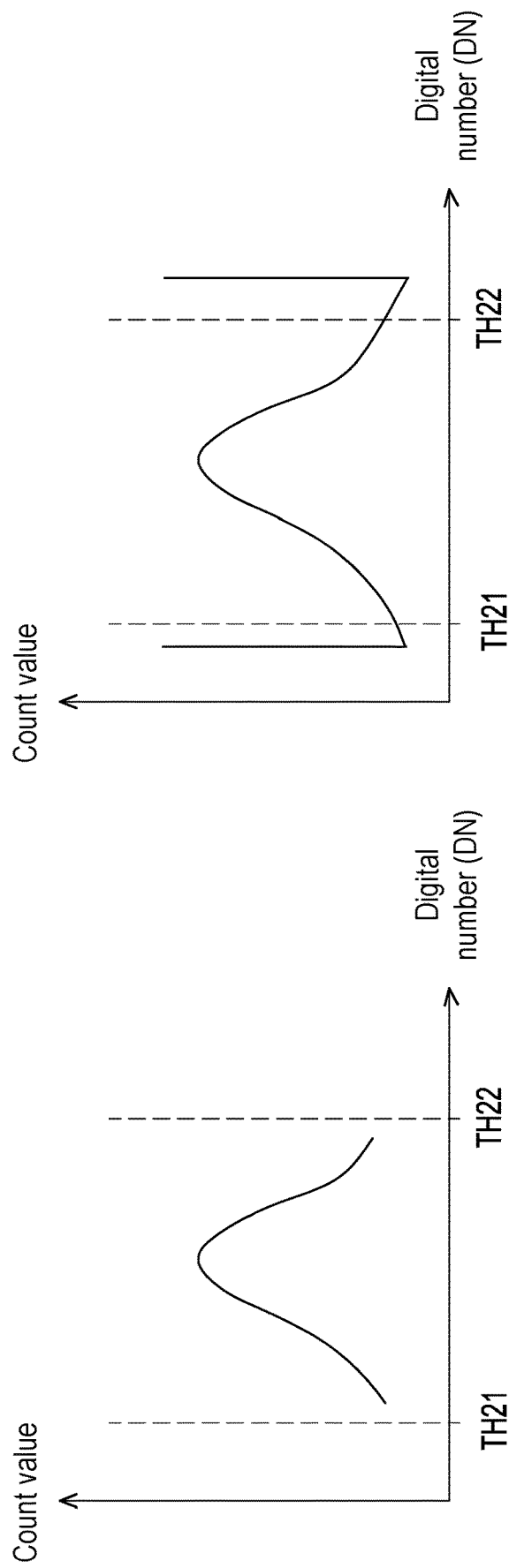

IMAGE SENSOR AND IMAGE SENSING METHOD JUDGING WHETHER A DIGITAL SENSING SIGNAL IS ABNORMAL

CROSS-REFERENCE TO RELATED APPLICATION

This application claims the priority benefit of U.S. provisional application Ser. No. 63/341,423, filed on May 13, 2022. The entirety of the above-mentioned patent application is hereby incorporated by reference herein and made a part of this specification.

BACKGROUND

Technical Field

The disclosure relates to a sensor, and in particular to an image sensor and an image sensing method.

Description of Related Art

Generally speaking, during the process of an image sensor sensing using a differential reading circuit, if there is strong light irradiating the image sensor or when the image sensor is used to sense strong light, the image sensor may have a dark sun effect. In this regard, in the case where transfer transistors of some pixels in a pixel array of the image sensor are not turned on, floating diffusion nodes thereof may be discharged, which causes subsequent reading errors. For example, areas of an image generated by the image sensor that would otherwise be extremely bright will be darkened. However, the issue is traditionally solved through designing an additional clamp circuit in a pixel circuit, which causes an increase in chip manufacturing costs and the issue that the circuit size cannot be further reduced.

SUMMARY

The disclosure provides an image sensor and an image sensing method, which can effectively solve the dark sun effect if the image sensor uses a differential reading circuit.

An image sensor of the disclosure includes a first pixel circuit, a second pixel circuit, a readout circuit, and an image processing circuit. The image processing circuit is coupled to the readout circuit. The readout circuit outputs a first digital sensing signal to the image processing circuit according to a floating diffusion node voltage of the first pixel circuit reset after a reset stage and a floating diffusion node voltage of the second pixel circuit reset after the reset stage during a reset signal readout period. The readout circuit outputs a second digital sensing signal to the image processing circuit according to a sensing result of the first pixel circuit and the floating diffusion node voltage of the second pixel circuit reset after the same reset stage during a sensing signal readout period. The image processing circuit judges whether a digital number of at least one of the first digital sensing signal and the second digital sensing signal is abnormal to decide whether to keep an original digital number, directly set a pixel value, or reset the second digital sensing signal.

An image sensing method of the disclosure includes the following steps. A first digital sensing signal is output to an image processing circuit through a readout circuit according to a floating diffusion node voltage of a first pixel circuit reset after a reset stage and a floating diffusion node voltage of a second pixel circuit reset after the reset stage during a reset signal readout period. A second digital sensing signal is output to the image processing circuit through the readout circuit according to a sensing result of the first pixel circuit and the floating diffusion node voltage of the second pixel circuit reset after the same reset stage during a sensing signal readout period. Whether a digital number of at least one of the first digital sensing signal and the second digital sensing signal is abnormal is judged through the image processing circuit to decide to keep an original digital number, directly set a pixel value, or reset the second digital sensing signal.

Based on the above, the image sensor and the image sensing method of the disclosure can automatically judge the digital number of the sensing signal to directly set the pixel value or reset the second digital sensing signal, so as to effectively solve the dark sun effect of the image sensor.

In order for the features and advantages of the disclosure to be more comprehensible, the following specific embodiments are described in detail in conjunction with the drawings.

BRIEF DESCRIPTION OF THE DRAWINGS

FIG. 4C is a schematic diagram of counting corresponding to a second digital sensing signal under a normal condition according to an embodiment of the disclosure.

FIG. 4D is a schematic diagram of counting corresponding to a second digital sensing signal under an abnormal condition according to an embodiment of the disclosure.

DETAILED DESCRIPTION OF DISCLOSED EMBODIMENTS

Figure 1:
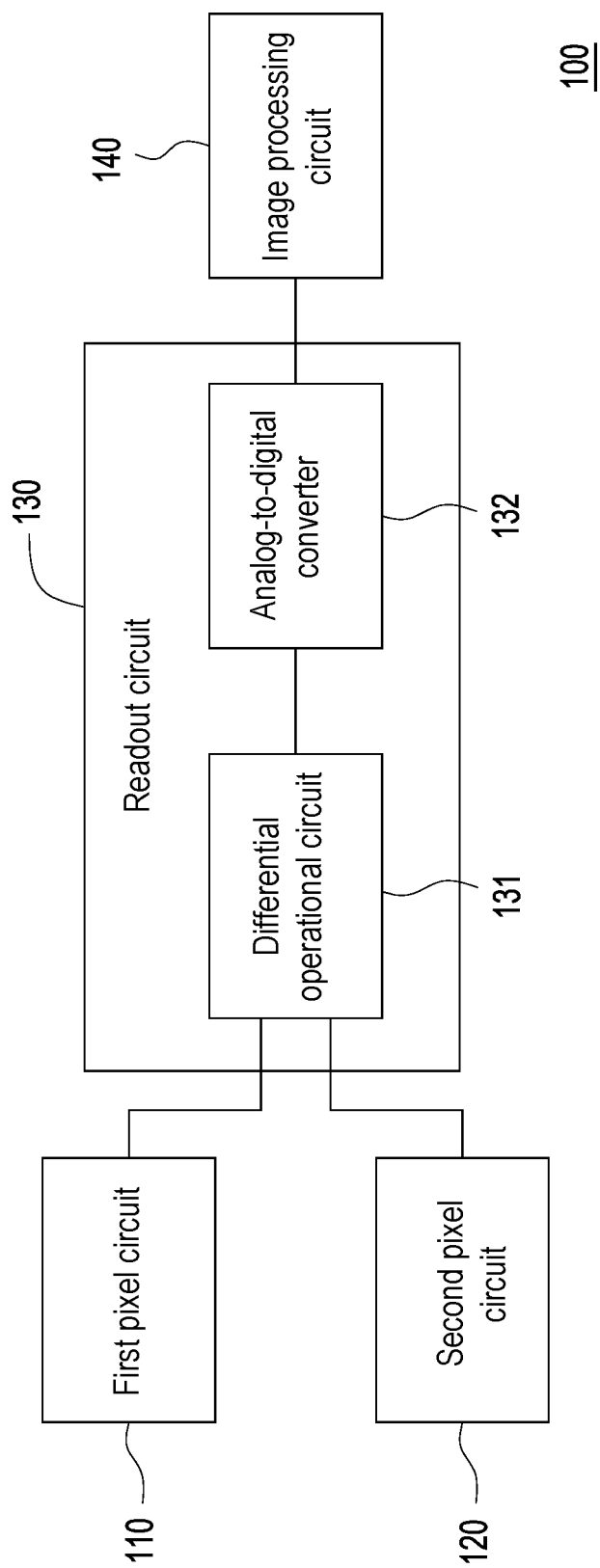
FIG. 1 is a schematic circuit diagram of an image sensor according to an embodiment of the disclosure.

In order for the content of the disclosure to be more comprehensible, the following specific embodiments are given as examples according to which the disclosure can indeed be implemented. In addition, wherever possible, elements/components/steps using the same reference numerals in the drawings and the embodiments represent the same or similar parts.

FIG. 1 is a schematic circuit diagram of an image sensor according to an embodiment of the disclosure. Referring to FIG. 1, an image sensor 100 includes a first pixel circuit 110, a second pixel circuit 120, a readout circuit 130, and an image processing circuit 140. In the embodiment, the image sensor 100 may be a CMOS image sensor (CIS) and may be an active pixel sensor (APS). The image sensor 100 may include a pixel array, and the pixel array may include multiple pixel groups, wherein each pixel group may, for example, include the first pixel circuit 110 and the second pixel circuit 120. The image processing circuit 130 may output multiple pixel values according to multiple sensing results of the pixel groups to generate a sensing image. The pixel array may be disposed in an active area (AA) of the image sensor 100. The readout circuit 130 and the image processing circuit 140 may be disposed in a peripheral area of the image sensor 100.

In the embodiment, the first pixel circuit 110 and the second pixel circuit 120 may correspond to two adjacent pixels and may be, for example, implemented as differential correlated double sampling circuits. The first pixel circuit 110 and the second pixel circuit 120 are coupled to the readout circuit 130. The readout circuit 130 is also coupled to the image processing circuit 140. The readout circuit 130 includes a differential operational circuit 131 and an analog-to-digital converter (ADC) 132. The first pixel circuit 110 and the second pixel circuit 120 are coupled to the differential operational circuit 131. The differential operational circuit 131 is also coupled to the analog-to-digital converter 132. The analog-to-digital converter 132 is also coupled to the image processing circuit 140. The first pixel circuit 110, the second pixel circuit 120, the differential operational circuit 131, and the analog-to-digital converter 132 may form a differential delta double sampling circuit. The differential operational circuit 131 may include a differential amplifier.

Figure 2:
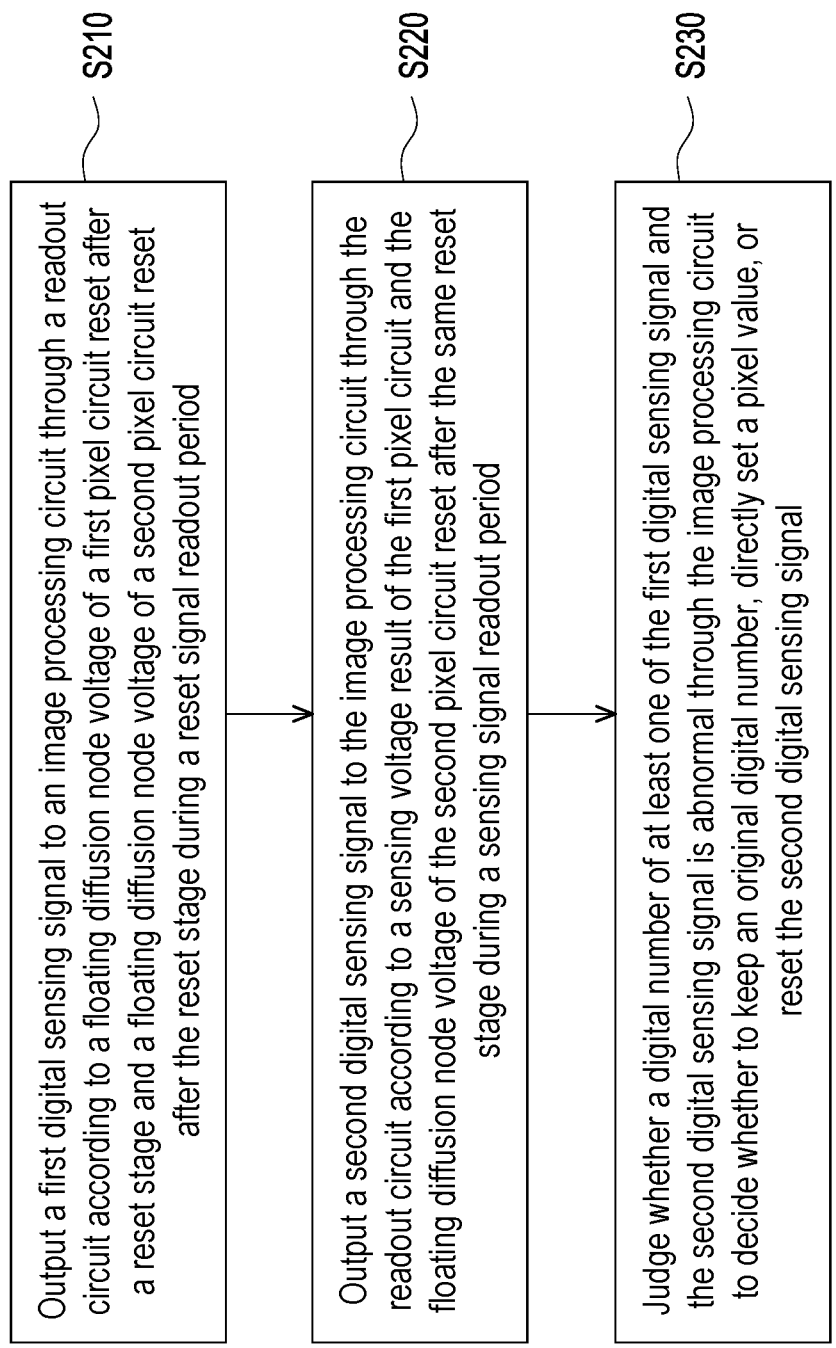
FIG. 2 is a flowchart of an image sensing method according to an embodiment of the invention.

FIG. 2 is a flowchart of an image sensing method according to an embodiment of the invention. Referring to FIG. 1 and FIG. 2, the image sensor 100 may, for example, execute Steps S210 to S230 below. In Step S210, during a first reset signal readout period (the reset signal here refers to that respective floating diffusion nodes of the first pixel circuit 110 and the second pixel circuit 120 do not have results of sensing units), the readout circuit 130 may output a first digital sensing signal to the image processing circuit 140 according to a floating diffusion node voltage of the first pixel circuit 110 reset after a reset stage and a floating diffusion node voltage of the second pixel circuit 120 reset after the reset stage. In the embodiment, the first pixel circuit 110 and the second pixel circuit 120 may respectively receive a reset signal, and the first pixel circuit 110 and the second pixel circuit 120 may respectively read out respective reset results to a first input terminal and a second input terminal of the differential operational circuit 131 according to an up ramp signal (applied on the floating diffusion node of the first pixel circuit 110) and a down ramp signal (applied on the floating diffusion node of the second pixel circuit 120), so that the differential operational circuit 131 outputs a first analog sensing signal to the analog-to-digital converter 132 according to the floating diffusion node voltage of the first pixel circuit 110 reset after the reset stage and the floating diffusion node voltage of the second pixel circuit 120 reset after the same reset stage. Moreover, the analog-to-digital converter 132 may output the first digital sensing signal to the image processing circuit 140 according to the first analog sensing signal.

In Step S220, during a first sensing signal readout period, the readout circuit 130 may output a second digital sensing signal to the image processing circuit 140 according to a sensing result of the first pixel circuit 110 and the floating diffusion node voltage of the second pixel circuit 120 reset after the same reset stage. In the embodiment, the first pixel circuit 110 may receive a transfer signal, and the first pixel circuit 110 and the second pixel circuit 120 may respectively read out the sensing result of the first pixel circuit 110 and the floating diffusion node voltage of the second pixel circuit 120 to the first input terminal and the second input terminal of the differential operational circuit 131 according to the up ramp signal (applied on the floating diffusion node of the first pixel circuit 110) and the down ramp signal (applied on the floating diffusion node of the second pixel circuit 120), so that the differential operational circuit 131 may output a second analog sensing signal to the analog-to-digital converter 132 according to the sensing result of the first pixel circuit 110 and the floating diffusion node voltage of the second pixel circuit 120 reset after the reset stage. Moreover, the analog-to-digital converter 132 may output the second digital sensing signal to the image processing circuit 140 according to the second analog sensing signal.

In Step S230, the image processing circuit 140 may judge whether a digital number of at least one of the first digital sensing signal and the second digital sensing signal is abnormal to decide to keep an original digital number, directly set a pixel value, or reset the second digital sensing signal. In the embodiment, the image processing circuit 140 and the image sensing method thereof may first automatically judge whether the digital number of at least one of the first digital sensing signal and the second digital sensing signal is abnormal to automatically correct the pixel value of a pixel corresponding to the first pixel circuit 110 in the sensing image to be output by the image processing circuit 140 or reset the second digital sensing signal, so that the pixel corresponding to the first pixel circuit 110 in the sensing image output by the image processing circuit 140 can have the correct pixel value.

Similarly, during a second reset signal readout period (the reset signal here refers to that the respective floating diffusion nodes of the first pixel circuit 110 and the second pixel circuit 120 do not have the results of the sensing units), the readout circuit 130 may output a third digital sensing signal to the image processing circuit 140 according to the floating diffusion node voltage of the first pixel circuit 110 reset after the reset stage and the floating diffusion node voltage of the second pixel circuit 120 reset after the reset stage. In the embodiment, the first pixel circuit 110 and the second pixel circuit 120 may respectively receive the reset signal, and the first pixel circuit 110 and the second pixel circuit 120 may respectively read out the respective reset results to the first input terminal and the second input terminal of the differential operational circuit 131 according to the down ramp signal (applied on the floating diffusion node of the first pixel circuit 110) and the up ramp signal (applied on the floating diffusion node of the second pixel circuit 120), so that the differential operational circuit 131 outputs a third analog sensing signal to the analog-to-digital converter 132 according to the floating diffusion node voltage of the first pixel circuit 110 reset after the reset stage and the floating diffusion node voltage of the second pixel circuit 120 reset after the same reset stage. Moreover, the analog-to-digital converter 132 may output the third digital sensing signal to the image processing circuit 140 according to the third analog sensing signal.

During a second sensing signal readout period, the readout circuit 130 may output a fourth digital sensing signal to the image processing circuit 140 according to a sensing result of the second pixel circuit 120 and the floating diffusion node voltage of the first pixel circuit 110 reset after the same reset stage. In the embodiment, the second pixel circuit 120 may receive the transfer signal, and the first pixel circuit 110 and the second pixel circuit 120 may respectively read out the sensing result of the second pixel circuit 120 and the floating diffusion node voltage of the first pixel circuit 110 to the first input terminal and the second input terminal of the differential operational circuit 131 according to the down ramp signal (applied on the floating diffusion node of the first pixel circuit 110) and the up ramp signal (applied on the floating diffusion node of the second pixel circuit 120), so that the differential operational circuit 131 may output a fourth analog sensing signal to the analog-to-digital converter 132 according to the sensing result of the second pixel circuit 120 and the floating diffusion node voltage of the first pixel circuit 110 reset after the reset stage. Moreover, the analog-to-digital converter 132 may output the fourth digital sensing signal to the image processing circuit 140 according to the fourth analog sensing signal.

The image processing circuit 140 may judge whether a digital number of at least one of the third digital sensing signal and the fourth digital sensing signal is abnormal to decide to keep the original digital number, directly set the pixel value, or reset the fourth digital sensing signal. In the embodiment, the image processing circuit 140 and the image sensing method thereof may first automatically judge whether the digital number of at least one of the third digital sensing signal and the fourth digital sensing signal is abnormal to automatically correct the pixel value of a pixel corresponding to the second pixel circuit 120 in the sensing image to be output by the image processing circuit 140 or reset the fourth digital sensing signal, so that the pixel corresponding to the second pixel circuit 120 in the sensing image output by the image processing circuit 140 can have the correct pixel value.

Figure 3:
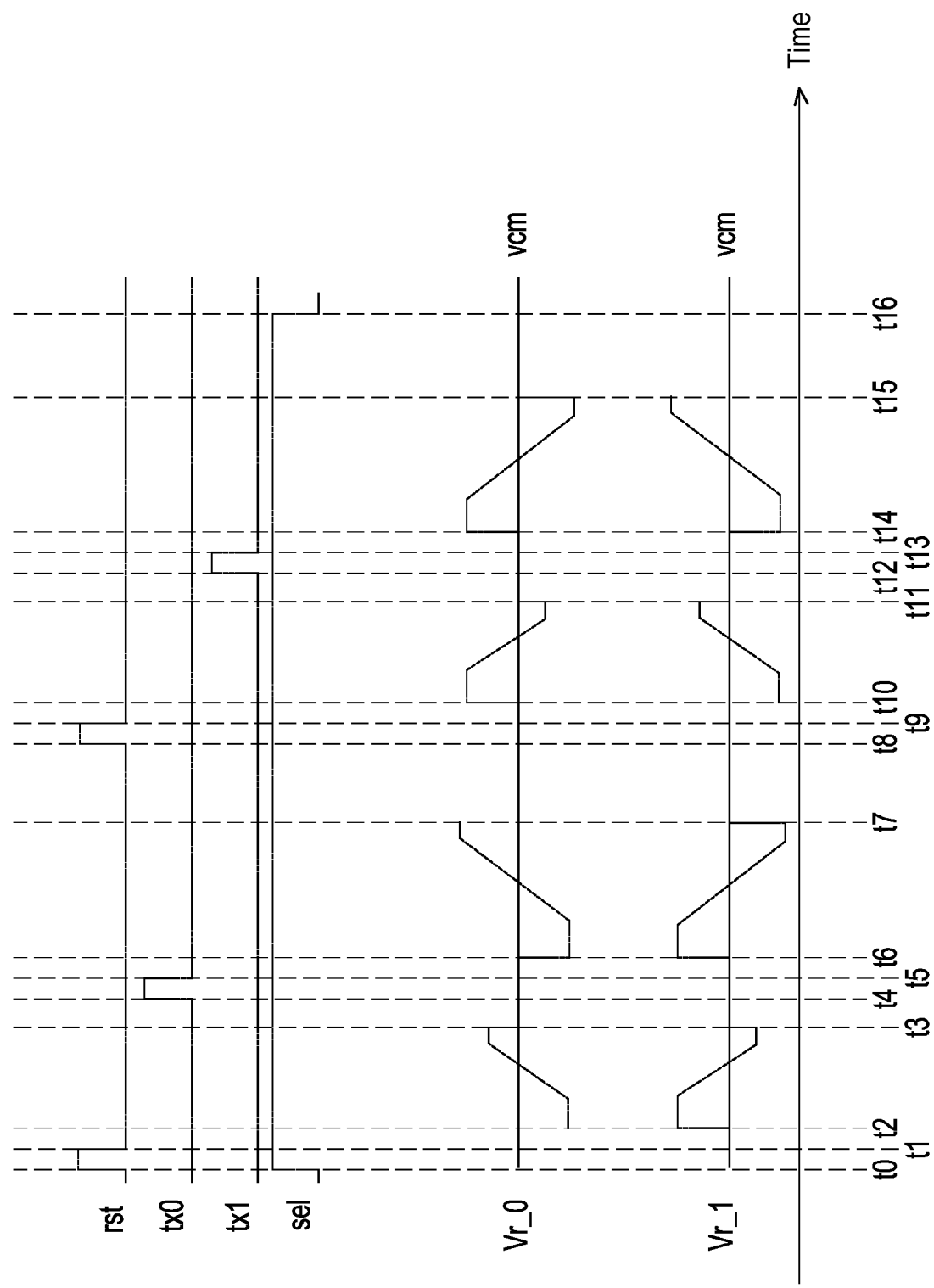
FIG. 3 is a signal waveform diagram of multiple signals according to an embodiment of the disclosure.
Figure 4A:
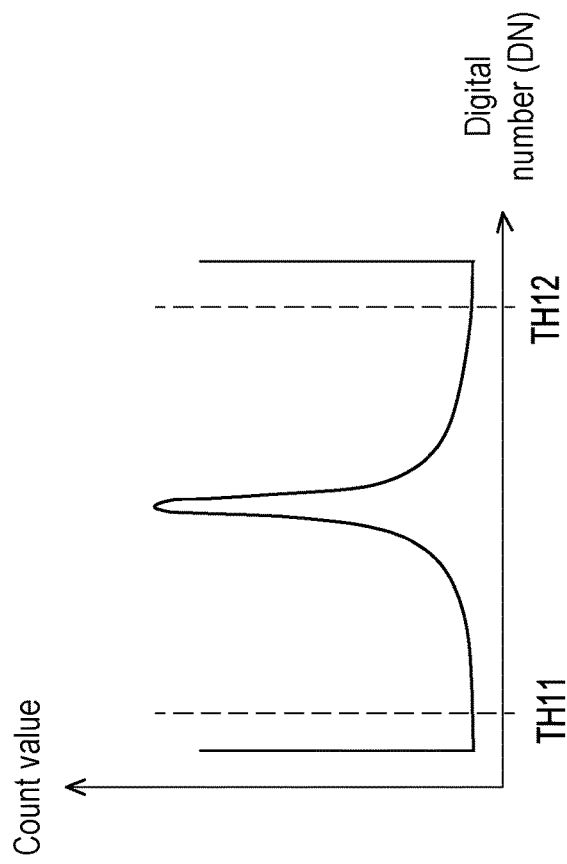
FIG. 4A is a schematic diagram of counting corresponding to a first digital sensing signal under a normal condition according to an embodiment of the disclosure.
Figure 4B:
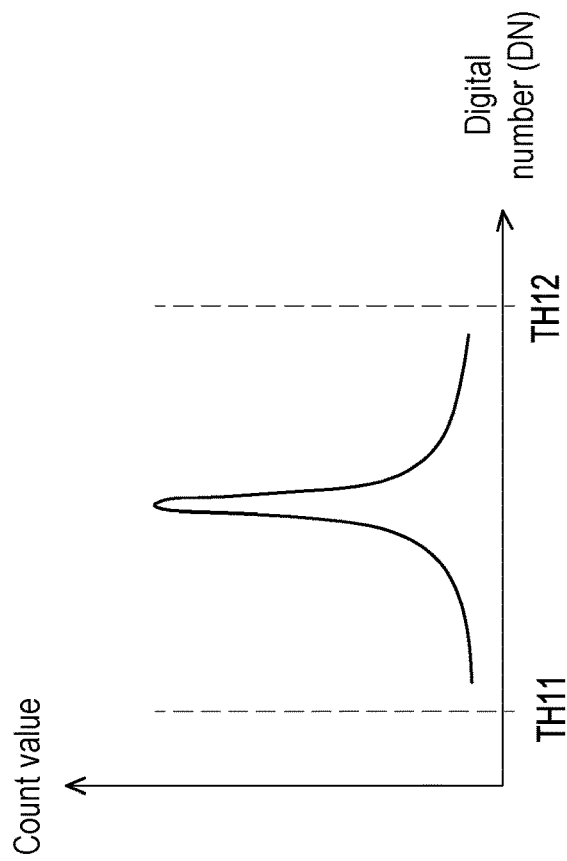
FIG. 4B is a schematic diagram of counting corresponding to a first digital sensing signal under an abnormal condition according to an embodiment of the disclosure.
Figure 5:
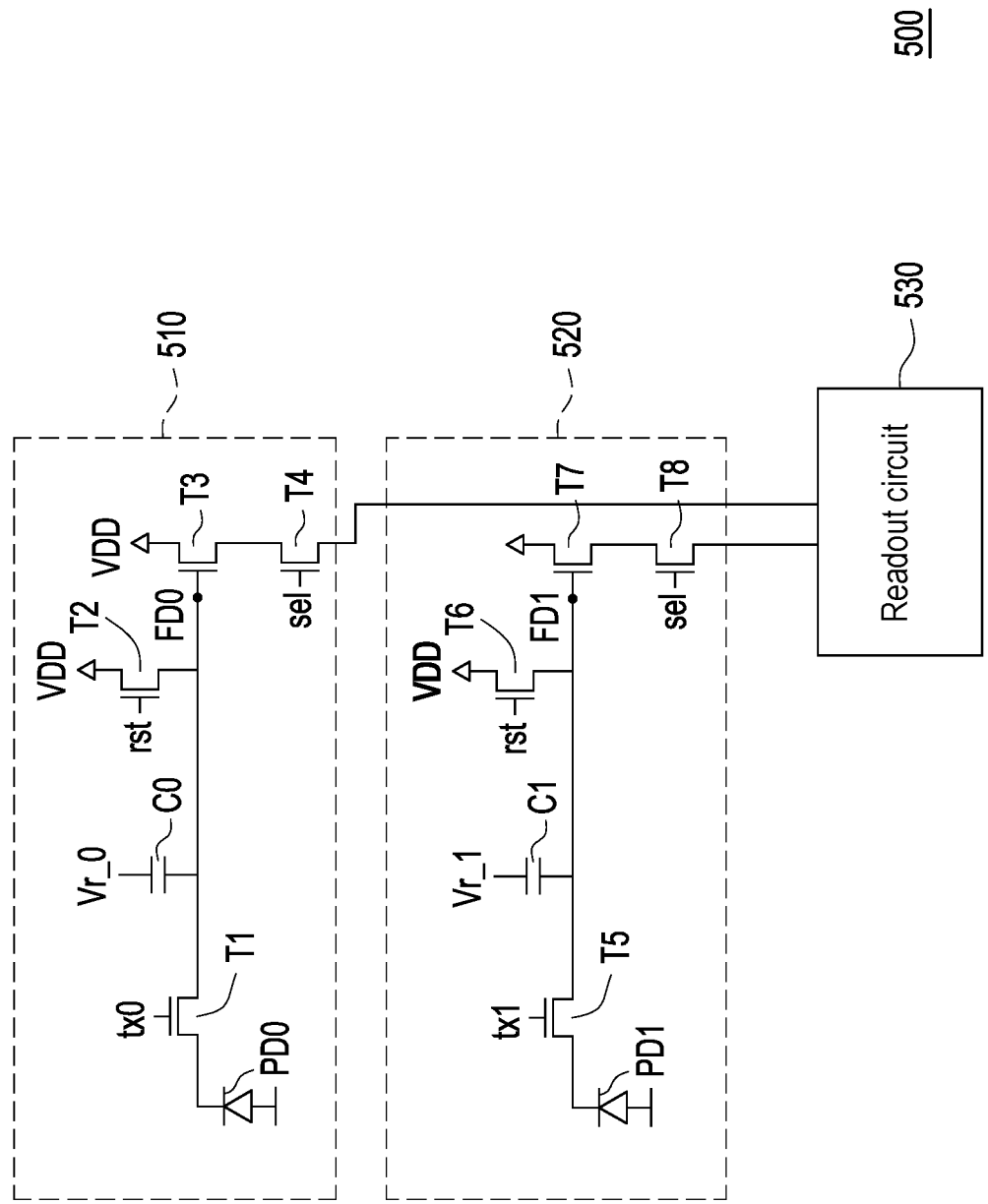
FIG. 5 is a schematic circuit diagram of an image sensor according to another embodiment of the disclosure.

FIG. 3 is a signal waveform diagram of multiple signals according to an embodiment of the disclosure. FIG. 4A is a schematic diagram of counting corresponding to a first digital sensing signal under a normal condition according to an embodiment of the disclosure. FIG. 4B is a schematic diagram of counting corresponding to a first digital sensing signal under an abnormal condition according to an embodiment of the disclosure. FIG. 4C is a schematic diagram of counting corresponding to a second digital sensing signal under a normal condition according to an embodiment of the disclosure. FIG. 4D is a schematic diagram of counting corresponding to a second digital sensing signal under an abnormal condition according to an embodiment of the disclosure. FIG. 5 is a schematic circuit diagram of an image sensor according to another embodiment of the disclosure. Referring to FIG. 3 to FIG. 5, the first pixel circuit 110, the second pixel circuit 120, and the readout circuit 130 of FIG. 1 may implement a first pixel circuit 510, a second pixel circuit 520, and a readout circuit 530 as shown in FIG. 5.

Referring to FIG. 5 first, in the embodiment, the first pixel circuit 510 includes a sensing unit PD0, a transfer transistor T1, a reset transistor T2, a readout transistor T3, a selection transistor T4, and a ramp capacitor C0. The sensing unit PD0 may be a photodiode. A first terminal of the transfer transistor T1 is coupled to a terminal of the sensing unit PD0. The other terminal of the sensing unit PD0 is coupled to a reference voltage (for example, a ground voltage). A second terminal of the transfer transistor T1 is coupled to a floating diffusion node FD0. The transfer transistor T1 is coupled between the sensing unit PD0 and the floating diffusion node FD0. A control terminal of the transfer transistor T1 receives a transfer signal tx0. A first terminal of the reset transistor T2 is coupled to an operating voltage VDD. A second terminal of the reset transistor T2 is coupled to the floating diffusion node FD0. A control terminal of the reset transistor T2 receives a control signal rst. A first terminal of the readout transistor T3 is coupled to the operating voltage VDD. A second terminal of the readout transistor T3 is coupled to a first terminal of the selection transistor T4. A control terminal of the readout transistor T3 is coupled to the floating diffusion node FD0. A second terminal of the selection transistor T4 is coupled to the readout circuit 530. A control terminal of the selection transistor T4 receives a selection signal se1. A terminal of the ramp capacitor C0 receives a first ramp signal Vr_0. The other terminal of the ramp capacitor C0 is coupled to the floating diffusion node FD0.

In the embodiment, the second pixel circuit 520 includes a sensing unit PD1, a transfer transistor T5, a reset transistor T6, a readout transistor T7, a selection transistor T8, and a ramp capacitor C1. The sensing unit PD1 may be a photodiode. A first terminal of the transfer transistor T5 is coupled to a terminal of the sensing unit PD1. The other terminal of the sensing unit PD1 is coupled to a reference voltage (for example, a ground voltage). A second terminal of the transfer transistor T5 is coupled to a floating diffusion node FD1. The transfer transistor T5 is coupled between the sensing unit PD1 and the floating diffusion node FD1. A control terminal of the transfer transistor T5 receives a transfer signal tx1. A first terminal of the reset transistor T6 is coupled to the operating voltage VDD. A second terminal of the reset transistor T6 is coupled to the floating diffusion node FD1. A control terminal of the reset transistor T6 receives the control signal rst. A first terminal of the readout transistor T7 is coupled to the operating voltage VDD. A second terminal of the readout transistor T7 is coupled to a first terminal of the selection transistor T8. A control terminal of the readout transistor T7 is coupled to the floating diffusion node FD1. A second terminal of the selection transistor T8 is coupled to the readout circuit 530. A control terminal of the selection transistor T8 receives the selection signal se1. A terminal of the ramp capacitor C1 receives a second ramp signal Vr_1. The other terminal of the ramp capacitor C1 is coupled to the floating diffusion node FD1.

In the embodiment, the transfer transistor T1, the reset transistor T2, the readout transistor T3, the selection transistor T4, the transfer transistor T5, the reset transistor T6, the readout transistor T7, and the selection transistor T8 may respectively be N-type transistors, but the disclosure is not limited thereto.

Referring to FIG. 3, during a period from time t0 to time t16, the selection signal se1 is at a high voltage level to turn on the selection transistor T4 and the selection transistor T8. During a period of a first reset stage from time t0 to time t1, the transfer signal tx0 and the transfer signal tx1 may be at low voltage levels, and the control signal rst may be at a high voltage level to turn off the transfer transistor T1 and the transfer transistor T5, and turn on the reset transistor T2 and the reset transistor T6. The voltages of the floating diffusion node FD0 and the floating diffusion node FD1 may be reset to the operating voltage VDD.

Time t1 to time t4 are the first reset signal readout period. It should be noted that the reset signal here refers to that the respective floating diffusion nodes of the first pixel circuit 110 and the second pixel circuit 120 do not have the sensing results of the sensing units. During a period from time t1 to time t4, the transfer signal tx0, the transfer signal tx1, and the control signal rst may be at low voltage levels to turn off the transfer transistor T1, the transfer transistor T5, the reset transistor T2, and the reset transistor T6. The voltages of the floating diffusion node FD0 and the floating diffusion node FD1 may be pulled down or pulled up according to the voltages coupled by the ramp capacitor C0 and the ramp capacitor C1.

During a period from time t2 to time t3, the transfer signal tx0, the transfer signal tx1, and the control signal rst may be at low voltage levels to turn off the transfer transistor T1, the transfer transistor T5, the reset transistor T2, and the reset transistor T6. The floating diffusion node FD0 may couple the first ramp signal Vr_0 through the ramp capacitor C0, and the floating diffusion node FD1 may couple the second ramp signal Vr_1 through the ramp capacitor C1. The voltages of the floating diffusion node FD0 and the floating diffusion node FD1 may be gradually pulled up and pulled down by the ramp signals. The first ramp signal Vr_0 and the second ramp signal Vr_1 are a pair of up and down ramp signals. During this period, the first ramp signal Vr_0 may form the up ramp signal, and the second ramp signal Vr_1 may form the down ramp signal. The readout circuit 530 may read out the charges of the floating diffusion node FD0 and the floating diffusion node FD1 (not including the sensing results of the sensing unit PD0 and the sensing unit PD1) through the readout transistor T3 and the readout transistor T7 operating as source followers to generate the first digital sensing signal (that is, a reset result corresponding to the floating diffusion node FD0).

During a period from time t4 to time t5, the transfer signal tx0 may be at a high voltage level, and the transfer signal tx1 and the control signal rst may be at low voltage levels to turn on the transfer transistor T1 and turn off the transfer transistor T5, the reset transistor T2, and the reset transistor T6. The sensing result of the sensing unit PD0 may be transmitted to the floating diffusion node FD0.

Time t5 to time t8 are the first sensing signal readout period. During a period from time t6 to time t7, the floating diffusion node FD0 may couple the first ramp signal Vr_0 through the ramp capacitor C0, and the floating diffusion node FD1 may couple the second ramp signal Vr_1 through the ramp capacitor C1. The voltages of the floating diffusion node FD0 and the floating diffusion node FD1 may be gradually pulled up and pulled down by the ramp signals. During this period, the first ramp signal Vr_0 may form the up ramp signal, and the second ramp signal Vr_1 may form the down ramp signal. The readout circuit 530 may read out the charges of the floating diffusion node FD0 and the floating diffusion node FD1 (that is, a sensing voltage of the sensing unit PD0 and a reference voltage of the floating diffusion node FD1) through the readout transistor T3 and the readout transistor T7 operating as the source followers to generate the second digital sensing signal (that is, a sensing result generated according to the sensing voltage of the sensing unit PD0 and the reference voltage of the floating diffusion node FD1).

During a period of the reset stage from time t8 to time t9, the transfer signal tx0 and the transfer signal tx1 may be at low voltage levels, and the control signal rst may be at a high voltage level to turn off the transfer transistor T1 and the transfer transistor T5, and turn on the reset transistor T2 and the reset transistor T6. The voltages of the floating diffusion node FD0 and the floating diffusion node FD1 may be reset to the operating voltage VDD.

Time t9 to time t12 is the second reset signal readout period. It should be noted that the reset signal here refers to that the respective floating diffusion nodes of the first pixel circuit 110 and the second pixel circuit 120 do not have the sensing results of the sensing units. During a period from time t9 to time t12, the transfer signal tx0, the transfer signal tx1, and the control signal rst may be at low voltage levels to turn off the transfer transistor T1, the transfer transistor T5, the reset transistor T2, and the reset transistor T6. The voltages of the floating diffusion node FD0 and the floating diffusion node FD1 may be pulled down or pulled up first according to the voltages coupled by the ramp capacitor C0 and the ramp capacitor C1.

During a period from time t10 to time t13, the transfer signal tx0, the transfer signal tx1, and the control signal rst may be at low voltage levels to turn off the transfer transistor T1, the transfer transistor T5, the reset transistor T2, and the reset transistor T6. The floating diffusion node FD0 may couple the first ramp signal Vr_0 through the ramp capacitor C0, and the floating diffusion node FD1 may couple the second ramp signal Vr_1 through the ramp capacitor C1. The voltages of the floating diffusion node FD0 and the floating diffusion node FD1 may be gradually pulled up and pulled down by the ramp signals. The first ramp signal Vr_0 and the second ramp signal Vr_1 are a pair of up and down ramp signals. During this period, the first ramp signal Vr_0 may form a smaller down ramp signal, and the second ramp signal Vr_1 may form a smaller up ramp signal. The readout circuit 530 may read out the charges of the floating diffusion node FD0 and the floating diffusion node FD1 (not including the sensing results of the sensing unit PD0 and the sensing unit PD1) through the readout transistor T3 and the readout transistor T7 operating as the source followers to generate the third digital sensing signal (that is, a reset result corresponding to the floating diffusion node FD1).

During a period from time t12 to time t13, the transfer signal tx1 may be at a high voltage level, and the transfer signal tx0 and the control signal rst may be at low voltage levels to turn on the transfer transistor T5 and turn off the transfer transistor T1, the reset transistor T2, and the reset transistor T6. The sensing result of the sensing unit PD1 may be transmitted to the floating diffusion node FD1.

Time t13 to time t16 is the second sensing signal readout period. During a period from time t14 to time t15, the floating diffusion node FD0 may couple the first ramp signal Vr_0 through the ramp capacitor C0, and the floating diffusion node FD1 may couple the second ramp signal Vr_1 through the ramp capacitor C1. The voltages of the floating diffusion node FD0 and the floating diffusion node FD1 may be gradually pulled up and pulled down by the ramp signals. During this period, the first ramp signal Vr_0 may form a larger down ramp signal, and the second ramp signal Vr_1 may form a larger up ramp signal. The readout circuit 530 may read out the charges of the floating diffusion node FD0 and the floating diffusion node FD1 (that is, the sensing voltage of the sensing unit PD1 and the reference voltage of the floating diffusion node FD0) through the readout transistor T3 and the readout transistor T7 operating as the source followers to generate the fourth digital sensing signal (that is, a sensing result generated according to the sensing voltage of the sensing unit PD1 and the reference voltage of the floating diffusion node FD0).

Referring to FIG. 4A, in an embodiment, if the first pixel circuit 510 and the second pixel circuit 520 are not irradiated by strong light, during a process of the readout circuit 530 counting the reset result read out from the floating diffusion node FD0 (also the same for the floating diffusion node FD1) (during the reset signal readout period), the highest value of the digital number (DN) does not exceed a first highest threshold TH12 and/or the lowest value is not lower than a first lowest threshold TH11 (because during a period when the transfer transistor T1 and the transfer transistor T5 are not turned on, the floating diffusion node FD0 and the floating diffusion node FD1 do not undergo a large amount of discharge due to the irradiation of strong light). Therefore, when the image processing circuit subsequently judges that the digital number of the first digital sensing signal is not greater than the first highest threshold TH12 and is not less than the first lowest threshold TH11, the image processing circuit may judge that the first digital sensing signal is normal. Also, the image processing circuit may directly generate a corrected sensing signal (for example, in Step S608 or Step S708 below).

Alternatively, referring to FIG. 4B, in an embodiment, if the first pixel circuit 510 and the second pixel circuit 520 are irradiated by strong light, during the process of the readout circuit 530 counting the reset result read out from the floating diffusion node FD0 (also the same for the floating diffusion node FD1) (during the reset signal readout period), the highest value of the digital number (DN) may exceed the first highest threshold TH12 and/or the lowest value may be lower than the first lowest threshold TH11 (because during the period when the transfer transistor T1 and the transfer transistor T5 are not turned on, the floating diffusion node FD0 and the floating diffusion node FD1 may undergo a large amount of discharge due to the irradiation of strong light), which causes the readout circuit 530 to misjudge and a reading error occurs (should originally read out a digital number result of a count value corresponding to a normal peak value). Therefore, when the image processing circuit subsequently judges that the digital number of the first digital sensing signal is greater than the first highest threshold TH12 or is less than the first lowest threshold TH11, the image processing circuit may judge that the first digital sensing signal is abnormal. Also, the image processing circuit may automatically perform a subsequent adjustment accordingly (for example, in Step S607 or Step S707 below).

Alternatively, referring to FIG. 4C, during a process of the readout circuit 530 counting the sensing result read out from the floating diffusion node FD0 (also the same for the floating diffusion node FD1) (during the sensing signal readout period), there may also be abnormal peak values in counting results of the highest value and/or the lowest value of the digital number (DN) (because during the period when the transfer transistor T1 and the transfer transistor T5 are not turned on, the floating diffusion node FD0 and the floating diffusion node FD1 may not undergo a large amount of discharge due to the irradiation of strong light). Therefore, when the image processing circuit subsequently judges that the digital number of the second digital sensing signal is not greater than a second highest threshold TH22 and is not less than a second lowest threshold TH21, the image processing circuit may judge that the second digital sensing signal is normal. Also, the image processing circuit may directly generate the corrected sensing signal (for example, in Step S608 or Step S708 below).

Alternatively, referring to FIG. 4D, during the process of the readout circuit 530 counting the sensing result read out from the floating diffusion node FD0 (also the same for the floating diffusion node FD1) (during the sensing signal readout period), the digital number (DN) may also be abnormal (because during the period when the transfer transistor T1 and the transfer transistor T5 are not turned on, the floating diffusion node FD0 and the floating diffusion node FD1 may undergo a large amount of discharge due to the irradiation of strong light), which causes the readout circuit 530 to misjudge and a reading error occurs (should originally read out the digital number result of the count value corresponding to the normal peak value). Therefore, when the image processing circuit subsequently judges that the digital number of the second digital sensing signal is greater than the second highest threshold TH22 or is less than the second lowest threshold TH21, the image processing circuit may judge that the second digital sensing signal is abnormal. Also, the image processing circuit may automatically perform the subsequent adjustment accordingly (for example, in Step S607 or Step S707 below).

In addition, the thresholds described in various embodiments of the disclosure are the appropriate highest digital threshold and lowest digital threshold given to the image processing circuit before reading a signal, so as to be used for a digital logic in the image processing circuit to judge whether the sensing signal is abnormal. In addition, the judgment of the sensing signal is completed in the digital circuit, so the process scaling result of the digital circuit does not limit the functions of the disclosure. Moreover, the cost/area of the circuit may be reduced along with the process scaling.

Figure 6:
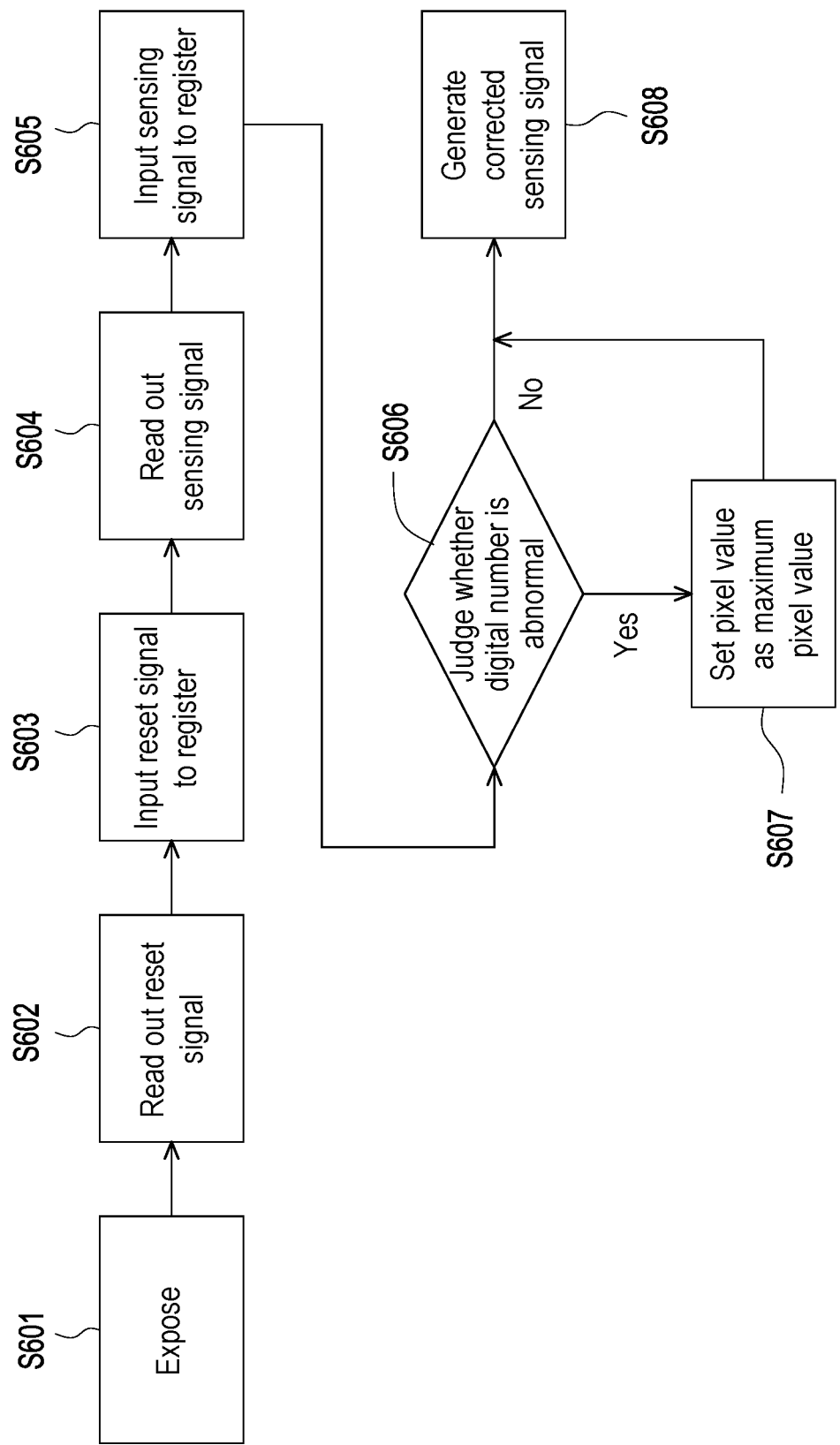
FIG. 6 is a flowchart of an image sensing method according to another embodiment of the disclosure.

FIG. 6 is a flowchart of an image sensing method according to another embodiment of the disclosure. Referring to FIG. 1 and FIG. 6, the image sensor 110 may, for example, execute Steps S601 to S608 below. In Step S601, the first pixel circuit 110 and the second pixel circuit 120 are respectively exposed. In Step S602, the readout circuit 130 respectively reads out the reset signals (that is, the first analog sensing signal and the third analog sensing signal) from the floating diffusion nodes of the first pixel circuit 110 and the second pixel circuit 120 during the first reset signal readout period and the second reset signal readout period. In Step S603, the readout circuit 130 inputs the reset signals to a register. The register may be disposed in the readout circuit 130. In Step S604, the differential operational circuit and the analog-to-digital converter of the readout circuit 130 may respectively read out the sensing signals (that is, the second analog sensing signal and the fourth analog sensing signal) according to the respective sensing results of the first pixel circuit 110 and the second pixel circuit 120 during the first sensing signal readout period and the second sensing signal readout period.

In Step S605, the readout circuit 130 inputs the sensing signals to the register. The register may be disposed in the readout circuit 130. The readout circuit 130 may convert the analog reset signals and the analog sensing signals into digital reset results (that is, the first digital sensing signal and the second digital sensing signal) and digital sensing results (that is, the third digital sensing signal and the fourth digital sensing signal), and store the respective digital numbers of the digital reset results and the digital sensing results in the register. In Step S606, the image processing circuit 140 judges whether the digital number of at least one of the digital reset results and the digital sensing results is abnormal. The image processing circuit 140 judges whether at least one of the digital reset results and the digital sensing results corresponds to the digital number of each pixel in the sensing image.

If not, in Step S608, the image processing circuit 140 generates the corrected sensing signal according to the digital number of the digital reset results and the digital sensing results. The image processing circuit 140 may subtract two pixel values of the pixels corresponding to the first pixel circuit 110 corresponding to the sensing image respectively in the first digital sensing signal and the second digital sensing signal to obtain the pixel value of the pixel (that is, the corrected sensing signal) corresponding to the first pixel circuit 110 in the sensing image. It should be noted that the digital reset result may represent background noise, and the background noise may refer to noise on a circuit between the floating diffusion node and the sensing unit. In addition, the image processing circuit 140 may subtract two pixel values of the pixels corresponding to the second pixel circuit 120 corresponding to the sensing image respectively in the third digital sensing signal and the fourth digital sensing signal to obtain the pixel value of the pixel (that is, the corrected sensing signal) corresponding to the second pixel circuit 120 in the sensing image.

If yes, in Step S607, the image processing circuit 140 may directly set the pixel value of the pixel with an abnormal digital number as the maximum pixel value (indicating that the pixel corresponding to the abnormal digital number receives strong light, and the brightness of the pixel corresponding to the first pixel circuit 110 and/or the second pixel circuit 120 in the sensing image is the highest). Next, in Step S608, the image processing circuit 140 generates the corrected sensing signal according to the digital number of the digital reset results and the digital sensing results. The image processing circuit 140 may subtract two pixel values of other pixels corresponding to the sensing image respectively in the digital reset result and the digital sensing result to obtain pixel values of the other pixels in the sensing image.

Therefore, when the image processing circuit 140 automatically judges that the digital number of at least one of the digital reset results and the digital sensing results is abnormal, the image processing circuit 140 may directly and automatically correct the pixel value of the corresponding pixel (to the highest pixel value corresponding to the highest brightness) in the sensing image to be output by the image processing circuit 140, so that each pixel of the sensing image output by the image processing circuit 140 can have the correct pixel value.

Figure 7:
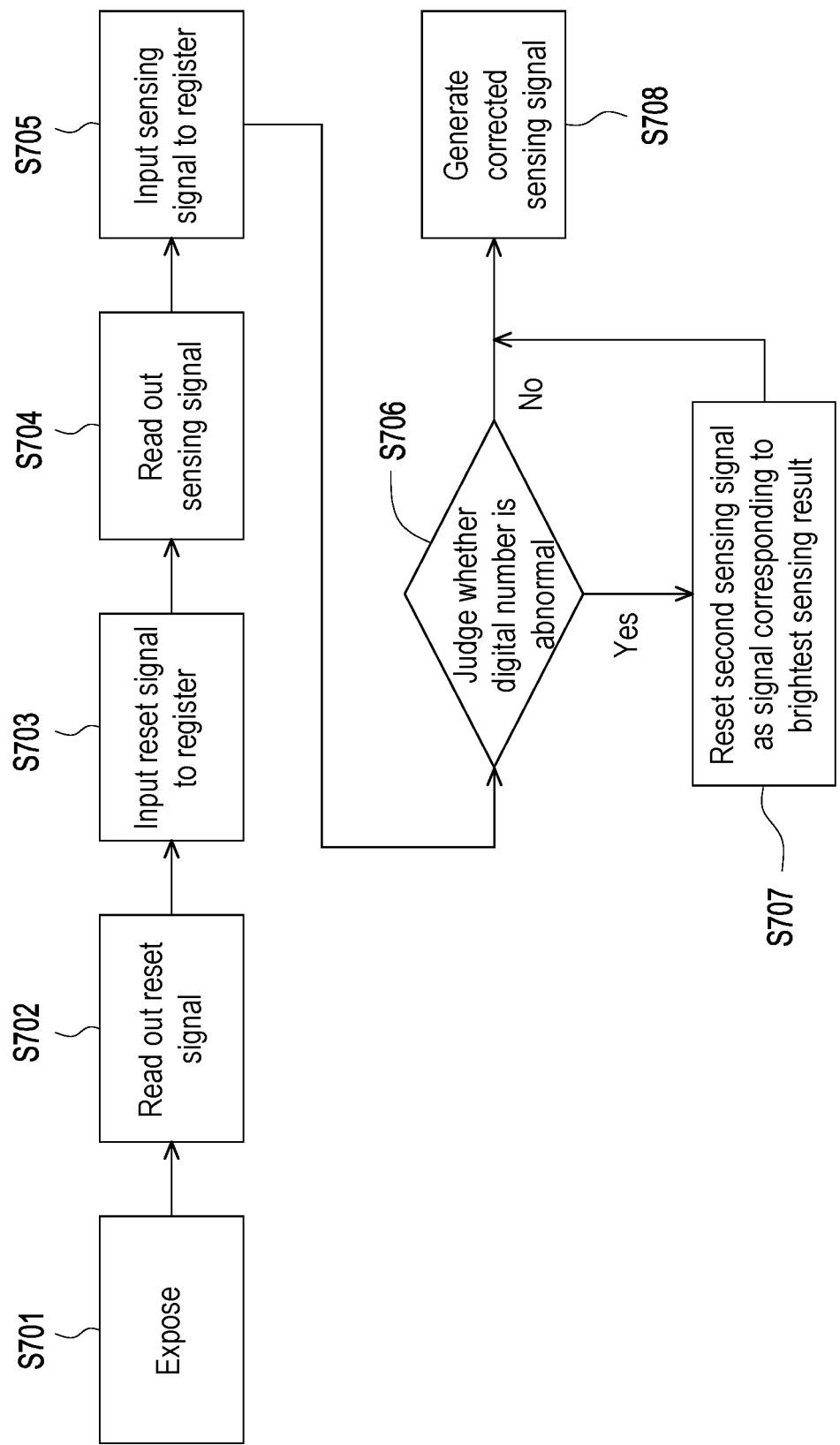
FIG. 7 is a flowchart of an image sensing method according to another embodiment of the disclosure.

FIG. 7 is a flowchart of an image sensing method according to another embodiment of the disclosure. Referring to FIG. 1 and FIG. 7, the image sensor 110 may, for example, execute Step S701 to S708 below. In Step S701, the first pixel circuit 110 and the second pixel circuit 120 are respectively exposed. In Step S702, the readout circuit 130 reads out the reset signal (that is, the first analog sensing signal) from the floating diffusion nodes of the first pixel circuit 110 and the second pixel circuit 120. In Step S703, the readout circuit 130 inputs the reset signal to the register. The register may be disposed in the readout circuit 130. In Step S704, the differential operational circuit and the analog-to-digital converter of the readout circuit 130 may read out the sensing signal (that is, the second analog sensing signal) according to the respective sensing results of the first pixel circuit 110 and the second pixel circuit 120.

In Step S705, the readout circuit 130 inputs the sensing signal to the register. The register may be disposed in the readout circuit 130. The readout circuit 130 may convert the analog reset result and the analog sensing result into the digital reset results (that is, the first digital sensing signal and a second digital sensing signal) and the digital sensing results (that is, the third digital sensing signal and the fourth digital sensing signal), and store the respective digital numbers of the digital reset results and the digital sensing results in the register. In Step S706, the image processing circuit 140 judges whether the digital number of at least one of the digital reset results and the digital sensing results is abnormal. The image processing circuit 140 judges whether at least one of the digital reset results and the digital sensing results corresponds to the digital number of each pixel in the sensing image.

If not, in Step S708, the image processing circuit 140 generates the corrected sensing signal according to the digital number of the digital reset results and the digital sensing results. The image processing circuit 140 may subtract two pixel values of the pixels corresponding to the first pixel circuit 110 corresponding to the sensing image respectively in the first digital sensing signal and the second digital sensing signal to obtain the pixel value of the pixel (that is, the corrected sensing signal) corresponding to the first pixel circuit 110 in the sensing image. It should be noted that the digital reset result may represent the background noise, and the background noise may refer to the noise on the circuit between the floating diffusion node and the sensing unit. In addition, the image processing circuit 140 may subtract two pixel values of the pixels corresponding to the second pixel circuit 120 corresponding to the sensing image respectively in the third digital sensing signal and the fourth digital sensing signal to obtain the pixel value of the pixel (that is, the corrected sensing signal) corresponding to the second pixel circuit 120 in the sensing image.

If yes, in Step S707, the image processing circuit 140 may reset a part of the second sensing signal (that is, reset the second digital sensing signal and/or the fourth digital sensing signal) corresponding to the pixels with the abnormal digital numbers of the first pixel circuit 110 and/or the second pixel circuit 120 to a signal corresponding to the brightest sensing result (indicating that the pixel corresponding to the abnormal digital number receives strong light, and the brightness of the pixel corresponding to the first pixel circuit 110 and/or the second pixel circuit 120 in the sensing image is the highest). Next, in Step S708, the image processing circuit 140 generates the corrected sensing signal according to the digital reset result and the reset second digital sensing signal and/or fourth digital sensing signal. The image processing circuit 140 may subtract two pixel values of other pixels corresponding to the sensing image respectively in the digital reset result and the reset second digital sensing signal and/or fourth digital sensing signal to obtain pixel values of the other pixels in the sensing image.

Therefore, when the image processing circuit 140 automatically judges that the digital number of at least one of the digital reset results and the digital sensing results is abnormal, the image processing circuit 140 may automatically correct the pixel value of the corresponding pixel in the digital sensing signal (to the highest pixel value corresponding to the highest brightness), so that each pixel of the sensing image output by the image processing circuit 140 can have the correct pixel value.

In summary, the image sensor and the image sensing method of the disclosure may first automatically judge whether at least one of the digital reset results and the digital sensing results of each pixel is abnormal. Moreover, the image sensor and the image sensing method of the disclosure may automatically correct the pixel value of the corresponding pixel in the sensing image to be output by the image processing circuit or reset the digital sensing signal, so that each pixel of the sensing image output by the image processing circuit has the correct pixel value to effectively solve the dark sun effect of the image sensor. Moreover, the circuit of the disclosure can reduce the area/cost along with the process scaling.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. An image sensor, comprising:
a first pixel circuit;
a second pixel circuit;
a readout circuit; and
an image processing circuit, coupled to the readout circuit,
wherein the readout circuit outputs a first digital sensing signal to the image processing circuit according to a floating diffusion node voltage of the first pixel circuit reset after a reset stage and a floating diffusion node voltage of the second pixel circuit reset after the reset stage during a reset signal readout period, wherein the readout circuit outputs a second digital sensing signal to the image processing circuit according to a sensing result of the first pixel circuit and the floating diffusion node voltage of the second pixel circuit reset after the same reset stage during a sensing signal readout period, wherein the image processing circuit judges whether a digital number of at least one of the first digital sensing signal and the second digital sensing signal is abnormal to decide whether to keep an original digital number, directly set a pixel value, or reset the second digital sensing signal.

2. The image sensor according to claim 1, wherein the image processing circuit directly sets the pixel value as a maximum pixel value when the image processing circuit judges that the digital number of at least one of the first digital sensing signal and the second digital sensing signal is abnormal.

3. The image sensor according to claim 1, wherein the image processing circuit resets the second digital sensing signal to a signal corresponding to a brightest sensing result when the image processing circuit judges that the digital number of at least one of the first digital sensing signal and the second digital sensing signal is abnormal.

4. The image sensor according to claim 1, wherein when a digital logic of the image processing circuit judges that the digital number of the first digital sensing signal is greater than a first highest threshold or is less than a first lowest threshold, the image processing circuit judges that the first digital sensing signal is abnormal.

5. The image sensor according to claim 1, wherein when a digital logic of the image processing circuit judges that the digital number of the second digital sensing signal is greater than a second highest threshold or is less than a second lowest threshold, the image processing circuit judges that the second digital sensing signal is abnormal.

6. The image sensor according to claim 1, wherein the readout circuit comprises:
a differential operational circuit, coupled to the first pixel circuit and the second pixel circuit; and
an analog-to-digital converter, coupled to the image processing circuit,
wherein the differential operational circuit outputs a first analog sensing signal to the analog-to-digital converter according to the floating diffusion node voltage of the first pixel circuit reset after the reset stage and the floating diffusion node voltage of the second pixel circuit reset after the same reset stage, and the analog-to-digital converter outputs the first digital sensing signal to the image processing circuit according to the first analog sensing signal during the reset signal readout period,
wherein the differential operational circuit outputs a second analog sensing signal to the analog-to-digital converter according to the sensing result of the first pixel circuit and the floating diffusion node voltage of the second pixel circuit reset after the reset stage, and the analog-to-digital converter outputs the second digital sensing signal to the image processing circuit according to the second analog sensing signal during the sensing signal readout period.

7. The image sensor according to claim 6, wherein the first pixel circuit, the second pixel circuit, the differential operational circuit, and the analog-to-digital converter form a differential delta double sampling circuit.

8. The image sensor according to claim 1, further comprising:
a plurality of pixel groups, coupled to the readout circuit and respectively comprising the first pixel circuit and the second pixel circuit,
wherein the image processing circuit outputs a plurality of pixel values according to a plurality of sensing results of the pixel groups to generate a sensing image.

9. The image sensor according to claim 1, wherein the first pixel circuit and the second pixel circuit respectively comprise:
a sensing unit;
a transfer transistor, coupled between the sensing unit and a floating diffusion node;
a reset transistor, coupled to the floating diffusion node;
a readout transistor, coupled to the floating diffusion node;
a selection transistor, coupled to the readout transistor; and
a ramp capacitor, coupled to the floating diffusion node.

10. The image sensor according to claim 1, wherein the ramp capacitor of the first pixel circuit receives a first ramp signal, and the ramp capacitor of the second pixel circuit receives a second ramp signal, wherein the first ramp signal and the second ramp signal are a pair of up and down ramp signals, and the transfer transistor of the second pixel circuit is not turned on during the reset signal readout period and the sensing signal readout period,
wherein the ramp capacitor of the first pixel circuit receives the second ramp signal, the ramp capacitor of the second pixel circuit receives the first ramp signal, and the transfer transistor of the first pixel circuit is not turned on during a next sensing signal readout period.

11. An image sensing method, comprising:
outputting a first digital sensing signal to an image processing circuit through a readout circuit according to a floating diffusion node voltage of a first pixel circuit reset after a reset stage and a floating diffusion node voltage of a second pixel circuit reset after the reset stage during a reset signal readout period;
outputting a second digital sensing signal to the image processing circuit through the readout circuit according to a sensing result of the first pixel circuit and the floating diffusion node voltage of the second pixel circuit reset after the same reset stage during a sensing signal readout period; and
judging whether a digital number of at least one of the first digital sensing signal and the second digital sensing signal is abnormal through the image processing circuit to decide whether to keep an original digital number, directly set a pixel value, or reset the second digital sensing signal.

12. The image sensing method according to claim 11, wherein the step of judging whether the digital number of at least one of the first digital sensing signal and the second digital sensing signal is abnormal to directly set the pixel value or reset the second digital sensing signal comprises:
directly setting the pixel value to a maximum pixel value through the image processing circuit when the image processing circuit judges that the digital number of at least one of the first digital sensing signal and the second digital sensing signal is abnormal.

13. The image sensing method according to claim 11, wherein the step of judging whether the digital number of at least one of the first digital sensing signal and the second digital sensing signal is abnormal to directly set the pixel value or reset the second digital sensing signal comprises:

resetting the second digital sensing signal to a signal corresponding to a brightest sensing result through the image processing circuit when the image processing circuit judges that the digital number of at least one of the first digital sensing signal and the second digital sensing signal is abnormal.

14. The image sensing method according to claim 11, wherein the step of judging whether the digital number of at least one of the first digital sensing signal and the second digital sensing signal is abnormal to directly set the pixel value or reset the second digital sensing signal comprises:

judging that the first digital sensing signal is abnormal through the image processing circuit when the digital number of the first digital sensing signal is greater than a first highest threshold or is less than a first lowest threshold.

15. The image sensing method according to claim 11, wherein the step of judging whether the digital number of at least one of the first digital sensing signal and the second digital sensing signal is abnormal to directly set the pixel value or reset the second digital sensing signal comprises:

judging that the second digital sensing signal is abnormal through the image processing circuit when the digital number of the second digital sensing signal is greater than a second highest threshold or is less than a second lowest threshold.

* * * * *